(12) United States Patent
Lee et al.

(10) Patent No.: US 7,812,465 B2
(45) Date of Patent: Oct. 12, 2010

(54) SEMICONDUCTOR CHIP HAVING ALIGNMENT MARK AND METHOD OF MANUFACTURING THE SAME

(75) Inventors: Jae Kul Lee, Seoul (KR); Yul Kyo Chung, Gyunggi-do (KR)

(73) Assignee: Samsung Electro-Machanics Co., Ltd., Suwon (KR)

( * ) Notice: Subject to any disclaimer, the term of this patent is extended or adjusted under 35 U.S.C. 154(b) by 0 days.

(21) Appl. No.: 12/232,528

(22) Filed: Sep. 18, 2008

(65) Prior Publication Data

US 2009/0315194 A1 Dec. 24, 2009

(30) Foreign Application Priority Data

Jun. 24, 2008 (KR) .................... 10-2008-0059560

(51) Int. Cl.
*H01L 23/544* (2006.01)
(52) U.S. Cl. ................ 257/797; 257/737; 257/E23.179
(58) Field of Classification Search ................ 257/737, 257/797, E23.179; 438/287, 401
See application file for complete search history.

(56) References Cited

U.S. PATENT DOCUMENTS

| | | | | |
|---|---|---|---|---|
| 6,278,193 | B1 * | 8/2001 | Coico et al. | 257/797 |
| 6,476,499 | B1 * | 11/2002 | Hikita et al. | 257/777 |
| 6,617,702 | B2 * | 9/2003 | Hsu et al. | 257/797 |
| 6,938,335 | B2 * | 9/2005 | Kuribayashi et al. | 29/834 |

* cited by examiner

*Primary Examiner*—Roy K Potter

(57) ABSTRACT

Disclosed is a semiconductor chip having an alignment mark which is formed on the surface of the semiconductor chip where no external connection bump is formed, and which has the position information of the external connection bump. A method of manufacturing the semiconductor chip having an alignment mark is also provided. Because the semiconductor chip includes the alignment mark having the position information of the external connection bump, the external connection bump is matched with a via which is formed in the external circuit layer of a printed circuit board including the semiconductor chip, thus improving electrical connection with the printed circuit board, and increasing the reliability of the printed circuit board including the semiconductor chip.

8 Claims, 5 Drawing Sheets

SEMICONDUCTOR CHIP HAVING ALIGNMENT MARK AND METHOD OF MANUFACTURING THE SAME

CROSS REFERENCE TO RELATED APPLICATION

This application claims the benefit of Korean Patent Application No. 10-2008-0059560, filed Jun. 24, 2008, entitled "Semiconductor chip having an align mark and a method for manufacturing the same", which is hereby incorporated by reference in its entirety into this application.

BACKGROUND OF THE INVENTION

1. Field of the Invention

The present invention relates to a semiconductor chip and a manufacturing method thereof, and more particularly, to a semiconductor chip, which has an alignment mark formed on the surface of the semiconductor chip where no external connection bump is formed and has the position information of the external connection bump, and to a method of manufacturing the same.

2. Description of the Related Art

Recently, the development of a printed circuit board (PCB) including a semiconductor chip is receiving attention as next-generation packaging technology for multi-functionalization and miniaturization.

The PCB including the semiconductor chip is advantageous in terms of high functionality, as well as multi-functionalization and miniaturization, and thereby solves problems related to decreased reliability in the course of making the electrical connection of the semiconductor chip using a wire bonding or solder ball for a flip chip or a BGA (ball grid array).

FIGS. 1A and 1B show the process of manufacturing a PCB including a semiconductor chip according to a conventional technique. With reference to these drawings, the problems of the conventional technique are described below.

As shown in FIG. 1A, a substrate body 10 including an insulating layer 13 having a cavity 20, in which a semiconductor chip 30 is to be mounted, and the semiconductor chip 30, disposed above the cavity 20, are provided. The semiconductor chip 30 is transferred in a state of being attached to a header, which is not shown, using a vacuum adsorption mechanism, and is thus mounted in the substrate body 10. After the semiconductor chip 30 is mounted, an insulating layer 70 is formed on the substrate body 10, and a circuit layer 90, including a circuit pattern 91 and a via 93 electrically connected with the connection pad 33 provided on one surface of the semiconductor chip 30, is then formed on the insulating layer 70, thus manufacturing the PCB including the semiconductor chip 30.

However, because the connection pad 33 of the semiconductor chip 30 is not externally observable due to the insulating layer 70 formed on the substrate body 10, it is difficult to determine the position of the via hole which is formed in the insulating layer 70 to expose the connection pad 33.

In order to maintain the position matching of the connection pad 33 and the via 93, the semiconductor chip 30 must be mounted in a state of being aligned with respect to a predetermined alignment standard. Conventionally, as shown in FIG. 1A, a detector 60 disposed between the substrate body 10 and the semiconductor chip 30 is used to detect the position of the circuit pattern 15 formed on the substrate body 10 and the position of the connection pad 33 of the semiconductor chip 30, and thus, the semiconductor chip 30 is mounted so that the position of the connection pad 33 is aligned with respect to the circuit pattern 15 formed on the substrate body 10.

However, the connection pad 33 is located not toward the circuit pattern 15 formed on the upper surface of the substrate body 10 but toward a circuit pattern 17 formed on the lower surface of the substrate body 10. Although the circuit pattern 15 formed on the upper surface of the substrate body 10 and the circuit pattern 17 formed on the lower surface of the substrate body 10 are formed to fulfill a predetermined matching requirement in order to realize interlayer connection, the circuit patterns 15, 17 formed on the upper and lower surfaces of the substrate body are not completely matched, attributable to an error in the process of exposing a photosensitive resist. So, the case where the semiconductor chip 30 is mounted based on the circuit pattern 15 formed on the substrate body 10 is problematic in that the connection pad 33 of the semiconductor chip 30 is not matched with the via 93 in the circuit layer 90 formed on the insulating layer 70, as shown in FIG. 1B.

Further, similar problems are caused even in a face-up mounting process, as well as a face-down mounting process. Specifically, in the case where the semiconductor chip is mounted through a face-up process, it is impossible to detect the position of the connection pad of the semiconductor chip by the header for transferring the semiconductor chip. Thus, in the face-up mounting process, the semiconductor chip is disposed based on the external shape of the semiconductor chip and the upper circuit pattern of the substrate body. However, in the case of the semiconductor chip, it does not have a predetermined external shape due to an error in the dicing process. Hence, the case where the semiconductor chip is mounted based on the external shape thereof incurs problems in which the position of the connection pad is not matched with the via hole of the external circuit layer.

Therefore, the semiconductor chip having a structure able to match the via 93 formed outside the substrate body 10 with the connection pad 33 of the semiconductor chip 30 and a method of manufacturing the same are required.

SUMMARY OF THE INVENTION

Therefore, the present invention has been made keeping in mind the above problems encountered in the related art, and provides a semiconductor chip, which is structured such that the position of the external connection bump of the semiconductor chip is matched with the position of the via in the external circuit layer of a base substrate, and also provides a method of manufacturing the same.

According to the present invention, a semiconductor chip may comprise an external connection bump, which is formed on one surface of the semiconductor chip to lead out the signal of an electronic circuit integrated in the semiconductor chip; and an alignment mark formed on the other surface of the semiconductor chip and having the position information of the external connection bump.

According to a preferred feature of the present invention, the alignment mark may be a metal pattern.

According to another preferred feature of the present invention, the alignment mark may be provided in the form of a recess in the other surface of the semiconductor chip.

According to a further preferred feature of the present invention, the alignment mark may be a color mark having a color different from the other surface of the semiconductor chip.

According to still a further preferred feature of the present invention, the alignment mark may have a pattern identical to that of the external connection bump.

In addition, according to the present invention, a method of manufacturing a semiconductor chip may comprise (A) providing a wafer including a plurality of semiconductor chips and an external connection bump formed on one surface of the wafer to lead out the signal of an electronic circuit integrated in each of the plurality of semiconductor chips; (B) forming an alignment mark having position information of the external connection bump on the other surface of the wafer; and (C) cutting the wafer into individual semiconductor chips.

According to a preferred feature of the present invention, forming the alignment mark may comprise (i) detecting the position of the external connection bump using a position detector and transmitting the detected information to a controller; and (ii) forming the alignment mark on the other surface of the semiconductor chip using a laser marker which is operated in response to the control signal of the controller.

According to another preferred feature of the present invention, forming the alignment mark may comprise (i) forming a resist layer on the other surface of the semiconductor chip; (ii) patterning an opening in the resist layer corresponding to the position of the external connection bump; and (iii) plating the opening and removing the remaining resist layer, thus forming a metal pattern.

According to a further preferred feature of the present invention, the laser marker may be a color laser marker.

According to still a further preferred feature of the present invention, the opening may have a pattern identical to that of the external connection bump.

The features and advantages of the present invention will be more clearly understood from the following detailed description taken in conjunction with the accompanying drawings.

Further, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

DESCRIPTION OF THE PREFERRED EMBODIMENTS

Figure 1A:
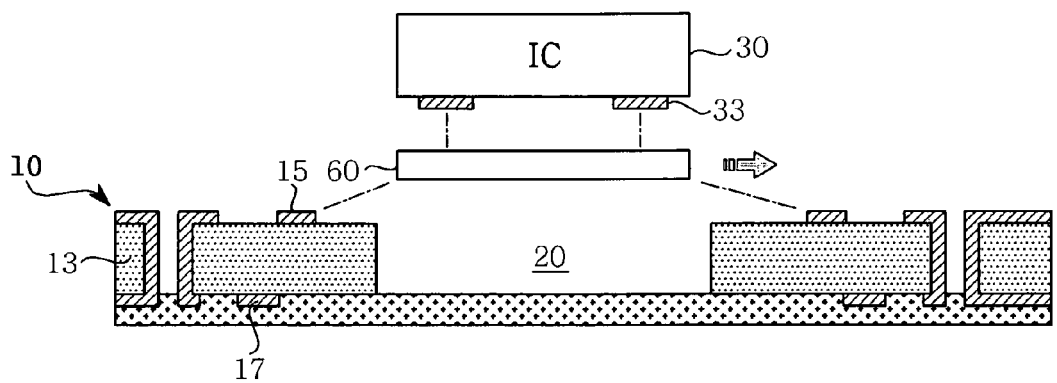
FIGS. 1A and 1B are schematic views showing the process of manufacturing a PCB including an electronic device according to a conventional technique.
Figure 1B:
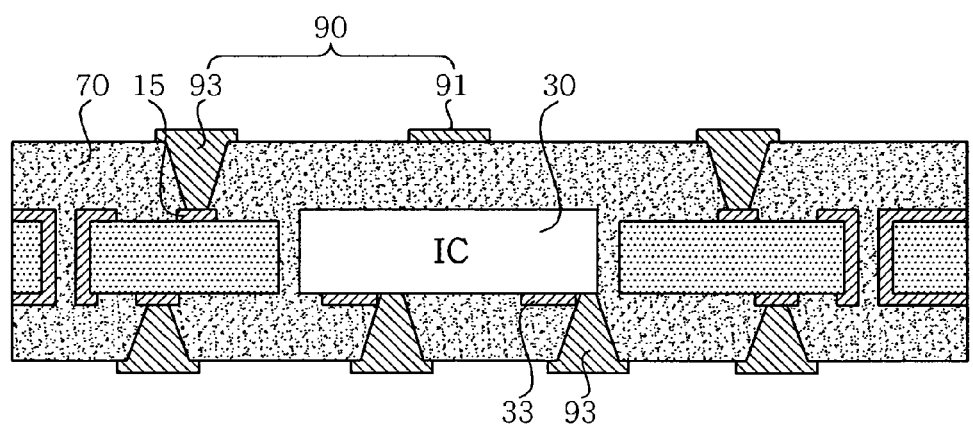

Hereinafter, a detailed description will be given of a semiconductor chip having an alignment mark and a method of manufacturing the same, according to preferred embodiments of the present invention, with reference to the appended drawings. Throughout the drawings, like reference numerals refer to like elements, and redundant descriptions are omitted.

In the description, the terms "first", "second" and so on are used to distinguish one element from another element, but are not to be construed to limit the elements.

Figure 2:
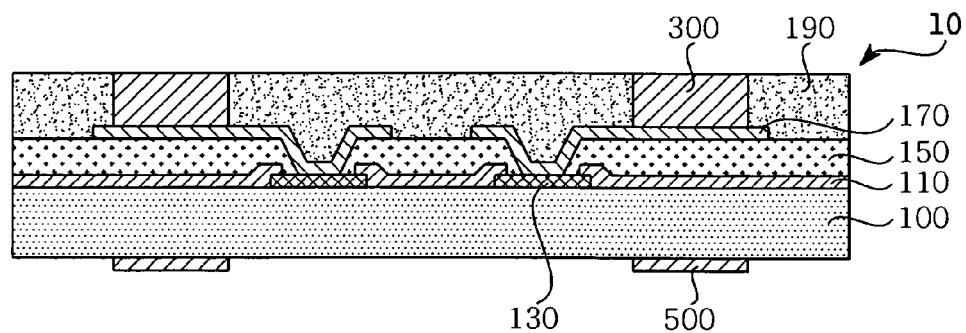
FIG. 2 is a cross-sectional view showing a semiconductor chip according to the present invention.

FIG. 2 is a cross-sectional view showing the semiconductor chip having an alignment mark according to the present invention. As shown in FIG. 2, the semiconductor chip 10 includes an external connection bump 300 formed in one surface thereof to lead out the signal of an electronic circuit integrated in the semiconductor chip 10, and also includes an alignment mark 500 formed on the other surface thereof and having the position information of the external connection bump 300.

The external connection bump 300 is a terminal for leading out the signal of the electronic circuit integrated in the semiconductor chip 10 and is formed on one surface of the semiconductor chip 10.

For example, the semiconductor chip 10 includes a bonding pad 130 electrically connected to an electronic circuit (not shown) on the chip body made of a silicon material and including the electronic circuit, a passivation layer 110 formed on the chip body to expose the bonding pad 130, a first insulating layer 150 formed on the passivation layer 110 and having an opening for exposing the bonding pad 130, a rewiring layer 170 extended onto the first insulating layer 150 from the bonding pad 130 to guide a wiring from the bonding pad 130 to the connection pad, which is larger than the bonding pad and is located at a position different from the position of the bonding pad, a second insulating layer 190 for protecting the rewiring layer 170, and an external connection terminal formed on the rewiring layer 170.

Specifically, the external connection bump 300 is formed on the rewiring layer 170 which is electrically connected to the bonding pad 130, which is electrically connected with the electronic circuit formed on the chip body made of a silicon material.

The semiconductor chip 10 thus structured is referred to as a wafer-level package. The structure of the semiconductor chip 10 as described above is merely illustrative, and the external connection bump 300 may be provided in the form of another structure to lead out the signal inside the semiconductor chip 10, as will be understood by those skilled in the art.

The alignment mark 500 is formed on the other surface of the semiconductor chip 10, that is, on the surface of the semiconductor chip 10 opposite the surface on which the external connection bump 300 is formed, and has the position information of the external connection bump 300.

The expression "alignment mark has the position information" means that, when the position of the alignment mark 500 is detected, the position of the external connection bump 300 can be detected. That is, in the case where it is possible to observe only the surface of the semiconductor chip 10 on which no external connection bump 300 is formed, the position of the external connection bump 300 may be identified from the position of the alignment mark 500.

FIG. 2 shows the alignment mark 500, which has the same pattern as that of the external connection bump 300, that is, which has a protruding metal pattern symmetrically formed on the basis of the position of the external connection bump of the semiconductor chip 10. In this way, when the pattern of the alignment mark 500 is the same as that of the external connection bump 300, the position of the alignment mark 500 is detected, thus facilitating the identification of the position of the external connection bump 300 formed on the surface of the semiconductor chip opposite the surface on which the alignment mark is formed.

However, the position of the alignment mark 500 is illustrative and is not limited thereto. That is, the alignment mark 500 need not be symmetrically located on the basis of the external connection bump 300 as long as the position of the external connection bump 300 can be identified from the position of the alignment mark. Specifically, the alignment mark 500 may be formed merely on the basis of the outermost bump of the semiconductor chip 10, or alternatively, the alignment mark 500 may be located regardless of the position of the external connection bump 300. However, in the case where the alignment mark 500 is located regardless of the position of the external connection bump 300, the relation between the external connection bump 300 and the alignment mark 500 must be established. That is, the position of the external connection bump 300 must be identified from the detection of the alignment mark 500 by means of an arithmetic device, such as a computer.

Further, the shape of the alignment mark 500 is not limited. The alignment mark 500 may be provided in the form of a recess, as an alternative to the protrusion pattern as shown in FIG. 2, and furthermore, the alignment mark may be a color mark having a color different from that of the semiconductor chip 10. Any alignment mark may be used as long as it is capable of being differentiated from the other portions of the semiconductor chip 10 through a sensor or an imaging system.

Figure 3:
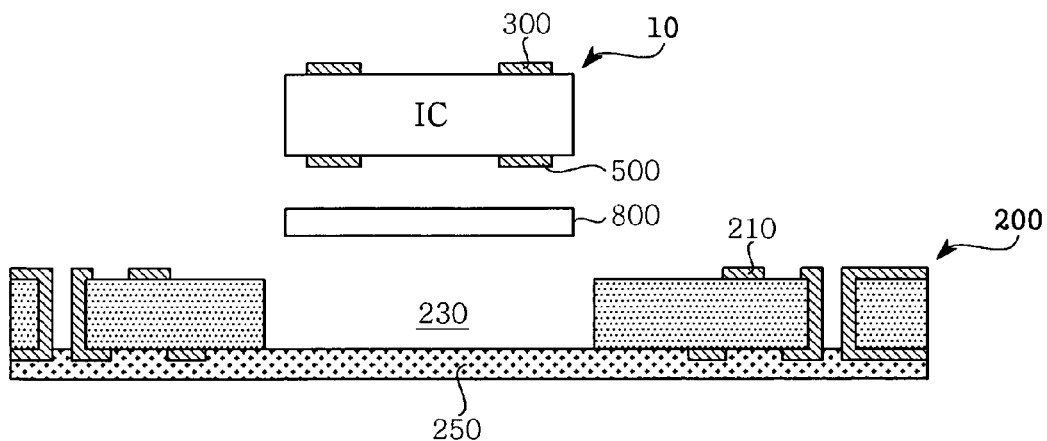
FIGS. 3 to 10 are schematic views sequentially showing a process of manufacturing the semiconductor chip, according to a first embodiment of the present invention.

With reference to FIG. 3, the semiconductor chip 10 according to a first embodiment of the present invention is described below.

A base substrate 200 having a cavity in which the semiconductor chip 10 is to be mounted is provided, and the semiconductor chip 10 is transferred above the cavity of the base substrate 200 by use of a header (not shown). The header is attached to the surface of the semiconductor chip 10 having the external connection bump 300 through a vacuum adsorption mechanism, in order to transport the semiconductor chip 10. As such, a position detector 800, for example, a camera, disposed between the semiconductor chip 10 and the base substrate 200, is used to detect the position of the alignment mark 500 of the semiconductor chip 10 and the position of the upper circuit pattern 210 of the base substrate 200. The position information collected by the position detector 800 is transmitted to a controller for controlling the movement of the header, and the controller functions to move the semiconductor chip 10 such that the header is disposed at the position where the external connection bump 300 of the semiconductor chip 10 is aligned with the upper circuit pattern 210 of the substrate.

Generally, when an internal circuit layer is formed, a mark for aligning is provided such that the internal circuit layer is electrically connected and matched with an external circuit layer which is built-up thereon, and such a mark has the form of a through-hole. Thus, when an insulating layer is formed on the internal circuit layer and a blind via hole is formed in the insulating layer, the position of the via hole is identified based on the position of the mark.

In the embodiment of the present invention, the alignment of the external connection bump 300 with the upper circuit pattern 210 of the base substrate 200 indicates that the external connection bump 300 is disposed based on the position of the mark for aligning of the upper circuit pattern 210.

After the semiconductor chip 10 is located at the correct position, the position detector 800 is removed in a horizontal direction, and the semiconductor chip 10 is mounted in the base substrate 200 by the use of the header.

Figure 4:
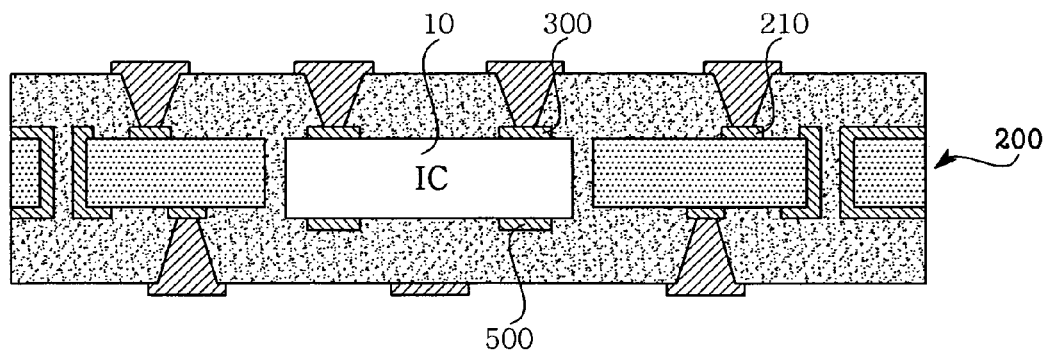

Next, as shown in FIG. 4, an insulating layer is formed on the upper and lower surfaces of the base substrate 200, and a circuit layer, which is electrically connected to the semiconductor chip 10 and the base substrate 200, is formed on the insulating layer. As such, the upper circuit layer, which is connected to the upper circuit pattern 210 of the base substrate 200, has a via, which is connected to the external connection bump 300 of the semiconductor chip 10 and the upper circuit pattern 210. The position of the via is determined based on the mark for aligning of the upper circuit pattern 210. As shown in the drawing, the reason why the via formed in the upper circuit layer is matched with the external connection bump 300 of the semiconductor chip 10 is that the external connection bump 300 of the semiconductor chip 10 is disposed such that it is aligned with the upper circuit pattern 210 of the base substrate 200.

In this way, because the semiconductor chip 10 according to the present embodiment has the alignment mark 500, it is matched with the circuit layer of the base substrate 200, thus improving electrical connection with the base substrate 200, thereby increasing the reliability of a PCB including the semiconductor chip 10.

Below, the method of manufacturing the semiconductor chip having the alignment mark according to the first embodiment of the present invention is described. FIGS. 5 to 10 sequentially show the process of manufacturing the semiconductor chip having the alignment mark according to the first embodiment of the present invention.

Figure 5:
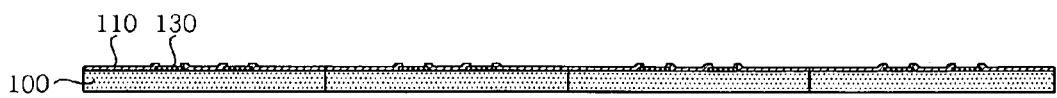

As shown in FIG. 5, a wafer including a plurality of semiconductor chips and dicing lines 550 formed between the semiconductor chips is provided.

This semiconductor chip has a structure in which the bonding pad 130 electrically connected to the integrated circuit (not shown) is formed on the upper surface of the chip body, which is made of a silicon material and includes the integrated circuit, and the passivation layer 110 is formed on the upper surface of the chip body to expose the bonding pad 130. The bonding pad 130 and the passivation layer 110 are formed through a fabrication (FAB) process.

Figure 6:
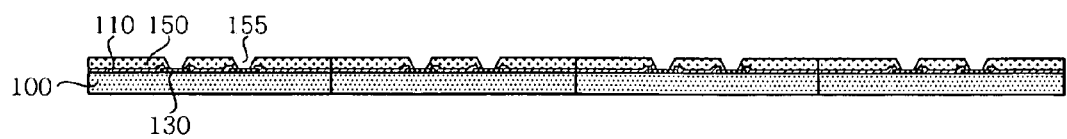

Next, as shown in FIG. 6, the first insulating layer 150 is formed on the passivation layer 110. The first insulating layer 150 has the opening 155 for exposing the bonding pad 130 of the semiconductor chip, and the opening 155 is formed by patterning the first insulating layer 150 using photolithography.

Figure 7:
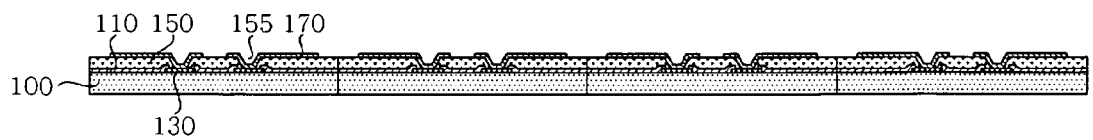

Next, as shown in FIG. 7, the redistribution layer 170 is formed. The redistribution layer 170 is connected with the bonding-pad 130 and is extended onto the first insulating layer 150.

Figure 8:
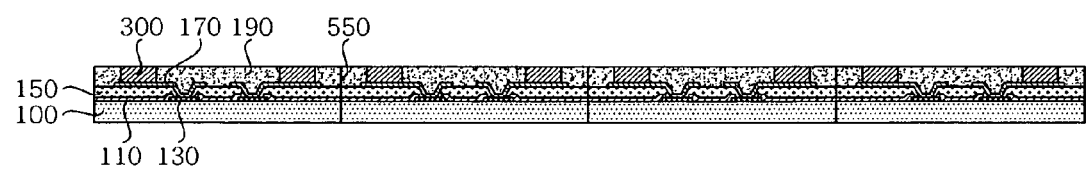

Next, as shown in FIG. 8, the second insulating layer 190 for covering the external connection bump 300, located at one end of the redistribution layer 170, and the redistribution layer 170 is formed.

Figure 9:
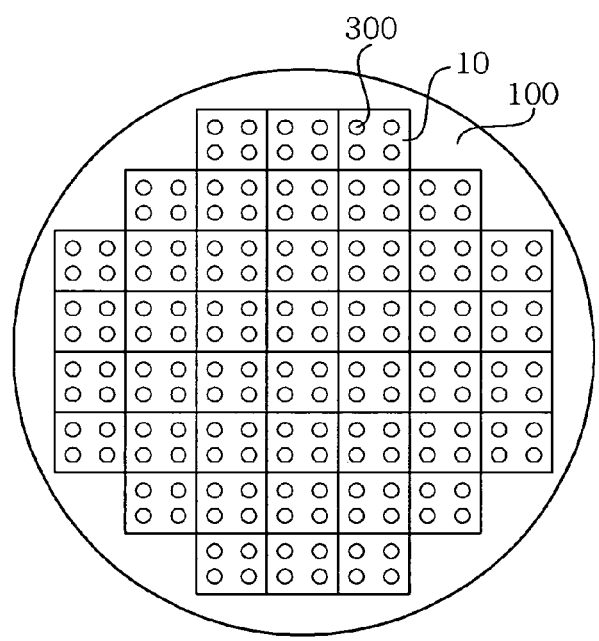

In this way, the semiconductor chip 10 having the external connection bump 300 may be manufactured. FIG. 9 is a top plan view showing the wafer 100 including semiconductor chips 10 manufactured through the above process. The semiconductor chip 10 thus manufactured is illustrative, or alternatively, it may be manufactured to have another structure or through another process. The process of manufacturing the semiconductor chip 10 according to the present embodiment is not to be construed so as to limit the scope of the present invention.

Figure 10:
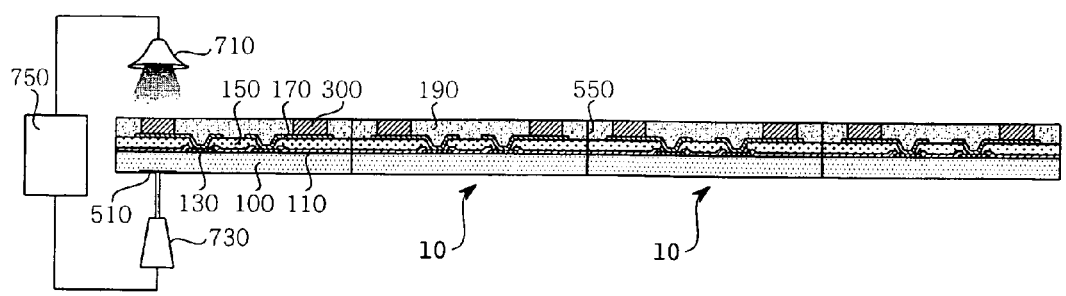

After the semiconductor chip 10 having the external connection bump 300 is manufactured, as shown in FIG. 10, the alignment mark 510 is formed on the surface of the semiconductor chip 10 on which no external connection bump 300 is formed using a laser system including a laser marker 730, a vision subsystem 710, and a controller 750. The vision subsystem 710 is an imaging device for detecting the position of the external connection bump 300 of the semiconductor chip 10. When the position of the external connection bump 300 is detected using the vision subsystem 710, the position information of the external connection bump 300 is transmitted to the controller 750, and the laser marker 730 is operated in response to the control signal of the controller 750. Such an operation enables the formation of the alignment mark 510 having the position information of the external connection bump 300 on the surface of the semiconductor chip 10 where no external connection bump 300 is formed.

When a laser is radiated onto the surface of the semiconductor chip 10 where no external connection bump 300 is formed, the alignment mark 510 having a recess shape is formed in the laser-radiated area. As mentioned above, the position of the alignment mark 510 on the basis of the position of the external connection bump 300 is not limited, and the position relation therebetween is recorded in the controller 750. This record may be used upon alignment of semiconductor chips 10.

In the case where the laser marker 730 is a color laser marker 730, the alignment mark 510 may be a color mark. That is, at the area where the color laser is radiated, a color mark having a color different from the other portions of the semiconductor chip 10 is formed. The color mark has the same function as the alignment mark 510.

After the completion of the process of forming the alignment mark 510 on the semiconductor chip 10 at the wafer level, the wafer is cut along the dicing lines 550, thus manufacturing the semiconductor chip 10 as shown in FIG. 2.

In addition, the method of manufacturing a semiconductor chip having an alignment mark according to a second embodiment of the present invention is described below. FIGS. 11 to 14 sequentially show the process of manufacturing the semiconductor chip having an alignment mark according to the second embodiment of the present invention. The description of portions which are the same as or similar to the first embodiment of the present invention is omitted.

Figure 11:
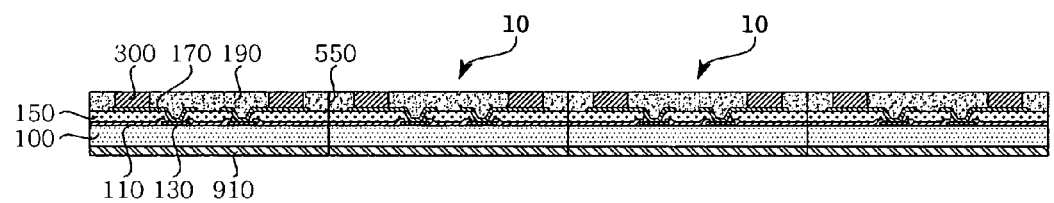
FIGS. 11 to 14 are schematic views sequentially showing a process of manufacturing the semiconductor chip, according to a second embodiment of the present invention.

When the semiconductor chip 10 having the external connection bump 300 as shown in FIG. 8 is completed, a photosensitive resist layer 910 is formed on the surface of the semiconductor chip 10 where no external connection bump 300 is formed, as shown in FIG. 11.

Figure 12:
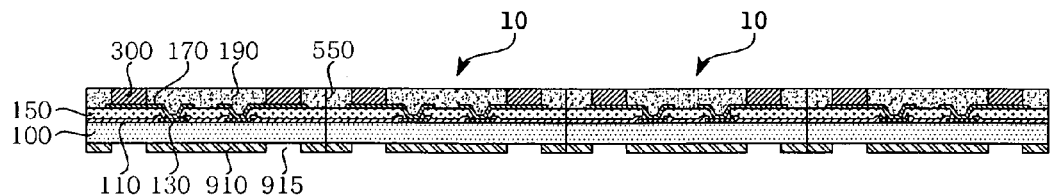

Next, as shown in FIG. 12, the photosensitive resist layer 910 is patterned to have an opening 915 for forming an alignment mark 530 (FIG. 13) through exposure and development. In this embodiment, the opening 915 for forming the alignment mark 530 is patterned to have the same pattern as that of the external connection bump 300. Because the wafer-level process is conducted more precisely than a typical PCB fabrication process, it is possible to form the opening 915 to have the same pattern as that of the external connection bump 300. The position and shape of the alignment mark 530 are not limited to those mentioned above.

Figure 13:
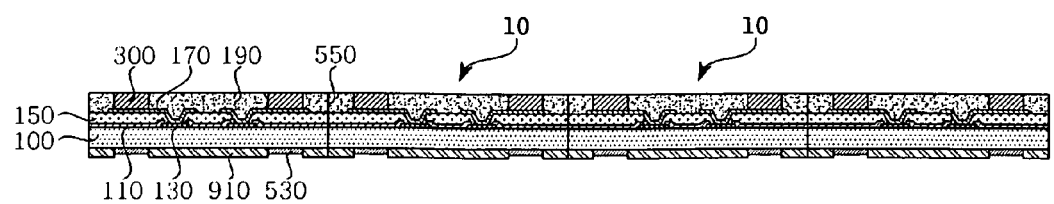

Next, as shown in FIG. 13, the opening 915 for forming the alignment mark 530 is plated. The plating may be performed using a metal such as copper, nickel, gold, etc.

Figure 14:
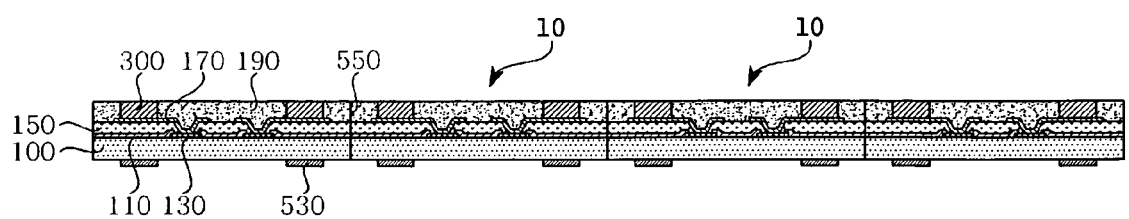

Next, as shown in FIG. 14, the remaining resist layer 910 is removed, and thereby the alignment mark 530 may be provided in the form of a protruding metal pattern.

In this way, when the process of forming the alignment mark 530 of the semiconductor chip 10 at the wafer level is completed, the wafer is cut along the dicing lines 550, thus manufacturing the semiconductor chip 10 as shown in FIG. 2.

As described hereinbefore, the present invention provides a semiconductor chip having an alignment mark and a method of manufacturing the same. According to the present invention, because the semiconductor chip includes the alignment mark having the position information of an external connection bump, the external connection bump of the semiconductor chip is matched with the via which is formed in the external circuit layer of a PCB including the semiconductor chip, thus improving electrical connection between the semiconductor chip and the PCB including the semiconductor chip, and thereby increasing the reliability of the PCB including the semiconductor chip.

Although the preferred embodiments of the present invention have been disclosed for illustrative purposes, those skilled in the art will appreciate that various modifications, additions and substitutions are possible within the technical scope of the invention.

What is claimed is:

1. A semiconductor chip having an alignment mark, comprising:
    an external connection bump, which is formed on one surface of the semiconductor chip to lead out a signal of an electronic circuit integrated in the semiconductor chip, the semiconductor chip being mounted in a printed circuit board (PCB) through a face-up process; and
    an alignment mark formed on another surface of the semiconductor chip and having position information of the external connection bump so that the external connection bump is aligned with a circuit pattern of the PCB.

2. A semiconductor chip having an alignment mark, comprising:
    an external connection bump, which is formed on one surface of the semiconductor chip to lead out a signal of an electronic circuit integrated in the semiconductor chip; and
    an alignment mark formed on another surface of the semiconductor chip and having position information of the external connection bump,
    wherein the alignment mark is a metal pattern.

3. The semiconductor chip as set forth in claim 1, wherein the alignment mark is provided in a form of a recess in the another surface of the semiconductor chip.

4. The semiconductor chip as set forth in claim 1, wherein the alignment mark is a color mark having a color different from the another surface of the semiconductor chip.

5. The semiconductor chip as set forth in claim 1, wherein the alignment mark has a pattern identical to that of the external connection bump.

6. The semiconductor chip as set forth in claim 1, wherein another surface of the semiconductor chip is a front face of the semiconductor chip.

7. The semiconductor chip as set forth in claim 1, wherein the alignment mark is a metal pattern.

8. A semiconductor chip having an alignment mark, comprising:
    an external connection bump, which is formed on a back surface of the semiconductor chip to lead out a signal of an electronic circuit integrated in the semiconductor chip; and
    an alignment mark formed on a front surface of the semiconductor chip and having position information of the external connection bump so that the external connection bump is aligned with a circuit pattern of the printed circuit board (PCB).

* * * * *

UNITED STATES PATENT AND TRADEMARK OFFICE
CERTIFICATE OF CORRECTION

PATENT NO. : 7,812,465 B2
APPLICATION NO. : 12/232528
DATED : October 12, 2010
INVENTOR(S) : Jae Kul Lee et al.

Page 1 of 1

It is certified that error appears in the above-identified patent and that said Letters Patent is hereby corrected as shown below:

On the title page, item [56]:

First page Column 1, line 1, delete "Electro-Machanics" and insert -- Electro-Mechanics --, therefor.

Signed and Sealed this
Third Day of May, 2011

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,812,465 B2 |
| APPLICATION NO. | : 12/232528 |
| DATED | : October 12, 2010 |
| INVENTOR(S) | : Jae Kul Lee et al. |

Page 1 of 1

It is certified that error appears in the above-identified patent and that said Letters Patent is hereby corrected as shown below:

On the title page, Item (73) Assignee

Delete "Electro-Machanics" and insert -- Electro-Mechanics --, therefor.

This certificate supersedes the Certificate of Correction issued May 3, 2011.

Signed and Sealed this
Thirty-first Day of May, 2011

David J. Kappos
*Director of the United States Patent and Trademark Office*